United States Patent [19]

Yang et al.

[11] Patent Number: 5,798,298
[45] Date of Patent: Aug. 25, 1998

[54] METHOD OF AUTOMATICALLY GENERATING DUMMY METALS FOR MULTILEVEL INTERCONNECTION

[75] Inventors: Ming-Tzong Yang, Hsinchu; Hong-Tsz Pan, Hsinchu Hsien, both of Taiwan

[73] Assignee: United Microelectronics Corporation, Hsinchu, Taiwan

[21] Appl. No.: 598,802

[22] Filed: Feb. 9, 1996

[51] Int. Cl.$^6$ .................................................. H01L 21/28
[52] U.S. Cl. ........................ 438/622; 438/624; 438/631; 438/926
[58] Field of Search ........................ 438/926, 622, 438/631, 632, 633, 624

[56] References Cited

U.S. PATENT DOCUMENTS 5,441,915  8/1995  Lee ........................................... 438/926
5,459,093  10/1995  Kuroda et al. ........................... 438/622
5,597,668  1/1997  Nowak et al. ............................ 430/5

Primary Examiner—T. N. Quach
Attorney, Agent, or Firm—Fish & Richardson P.C.

[57] ABSTRACT

A method of automatically generating dummy metals for multilevel interconnection makes use of a quantum array pattern accompanying an operating pattern to from a metal pattern. The method comprises the combination selected from intersection (AND), union (OR), oversizing, downsizing, or incorporation operation through computer-aided design (CAD). Therefore, the application of the metal pattern to a process for fabricating a multimetal structure can acquire full planarization between two metal layers because of the arrangement that several dummy metals are positioned among the metal lines to diminish the spacing which exceeds the planarization limit. Also, the dummy metals are shaped in blocks thereby preventing the loading effect during etching and decreasing the parasitic capacitance therebetween.

6 Claims, 7 Drawing Sheets

METHOD OF AUTOMATICALLY GENERATING DUMMY METALS FOR MULTILEVEL INTERCONNECTION

BACKGROUND OF THE INVENTION

1. Field of the Invention

The present invention generally relates to an IC (integrated circuits) fabrication process for multimetal interconnection, and, more particularly, relates to a method of automatically generating dummy metals among metal lines to ensure full planarization.

2. Technical Background

In order to build an integrated circuit, it's necessary to fabricate many active devices on a single substrate. Initially, each of the devices must be electrically isolated from the others, but later in the fabrication sequence specific devices must be electrically interconnected so as to implement the desired circuit function. Since both MOS and bipolar VLSI and ULSI devices invariably require more than one level of interconnection, many issues arise in creating such a multilevel interconnection structure. The main challenges in implementing such a structure for submicron device is the planarization of the interconnection dielectric layers.

Spin-on glass (SOG) is one interlevel-dielectric material that is applied in liquid form, and therefore exhibits planarization capabilities. SOG film can fill narrower spaces without causing voids than can CVD intermetal dielectric films. Even such crevices as those caused by closely spaced Metal-I and polysilicon edges can be planarized by SOG to a degree that allows for adequate metal step coverage. Other advantages of SOG films include: (a)simpler processing;(b) lower defect density;(c)higher throughput; (d)relatively low cost; and (e)no handling of depicted in FIG. 1B, in the condition that the spacing hazardous gases. FIG. 1A–1B depict a conventional process for multimetal planarization in cross-sectional views.

As shown in FIG. 1A, a dielectric layer 1, such as field oxide through local oxidation of silicon (LOCOS) is formed over a a semiconducting substrate (not shown in the drawing). After depositing a first metal layer overlying dielectric layer 1, a subsequent etching and patterning procedure is applied to define metal lines 10,11,12, and then a silicon oxide layer 13, about 300 Å in thickness, is deposited on the overall surface by plasma-enhanced chemical vapor deposition (PECVD). Owing to the configuration of metal lines 10,11,12 deposed onto dielectric layer 1, silicon oxide layer 13 displays an uneven surface. Afterwards, an SOG layer 14 is employed to planarize such an uneven surface. Because SOG materials are siloxanes or silicates mixed in alcohol-based solvents in liquid form, such materials can fill into the concave surface after being subjected to a spin cycle. After being spun on, the SOG is baked first at a low temperature (e.g. 150 °–250° C. for 1–15 min. in air), and then at a higher temperature (e.g. 400 °–425° C. for 30–60 min. in air). The solvent is first driven off, and water is evolved from the film ( due to the polymerization of the silanol [SiOH] groups).

Futhermore, referring to FIG. 1B, an etchback SOG process is applied to the surface of SOG layer 14 and then a silicon oxide layer 15, about 5000Å in thickness, is deposited over the planarized surface, actually on SOG layer 14. While the reactive ion etching (RIE) is utilized, a contact window 19 is formed through silicon oxide layers 13,15 and SOG layer 14 to expose the designated metal line 10; then a metal layer 16 is sputtered onto silicon oxide layer 15 to concurrently connect to metal line 10 via contact window 19.

Usually, the spacings among the metal lines are not constant and apparent diversity is inherent therebetween. As depicted in FIG. 1B, in the condition that the spacing between metal lines 10 and 11 is larger than that between metal lines 11 and 12, the portion 17 with smaller spacing can acquire quite a smooth surface, but gently concaved portion 18 appears because of larger spacing. Therefore, the sequentially deposited silicon oxide layer 15 and metal layer 16 also display uneven surfaces based on the shape of the underlying layer. While making use of lithography process, the uneven surface will result in inferior focusing, especially occurring in submicro devices. Generally speaking, the SOG planarization limit is between the range from about 5 μm to about 10 μm. If the spacing between the metal lines exceeds this upper limit, the gently-concaved surface depicted in FIG. 1B will inevitably appear. In other words, the conventional process can merely attain local planarization, not full planarization.

SUMMARY OF THE INVENTION

Therefore, it is an object of the present invention to provide a method of automatically generating dummy metal for multilevel interconnection and generating dummy metal among metal lines acquiring full planarization.

It is another object of the present invention to provide a method of automatically generating dummy metal for multilevel interconnection that prevents the etching loading effect while patterning a metal layer.

It is still another object of the present invention to provide a method of automatically generating dummy metal for multilevel interconnection to decrease the parasitic capacitance effect.

The method essentially includes the following steps:

extending outer-directedly a first distance along the periphery of the metal-line pattern and merging the overlapped regions thereof to form a first pattern standing for a portion except for the extended regions;

selecting overlapped portions of the first pattern and a block array pattern to form a second pattern;

extending outer-directedly a second distance along the periphery of the second pattern to form a third pattern; and positioning the metal-line pattern into the third pattern to form the metal pattern.

In general, the present invention can be attained by a method of automatically generating dummy metals for multilevel interconnection based on an operating pattern and an quantum array pattern, comprising a combination selected from intersection, union, incorporation, oversizing and downsizing operation to form dummy metal patterns among the operating pattern.

BRIEF DESCRIPTION OF THE DRAWINGS

Other objects, features and advantages of the present invention will become apparent by way of the following detailed description of the preferred but non-limiting embodiment. The description is made with reference to the accompanied drawings, wherein.

DESCRIPTION OF THE PREFERRED EMBODIMENT

Figure 1A:
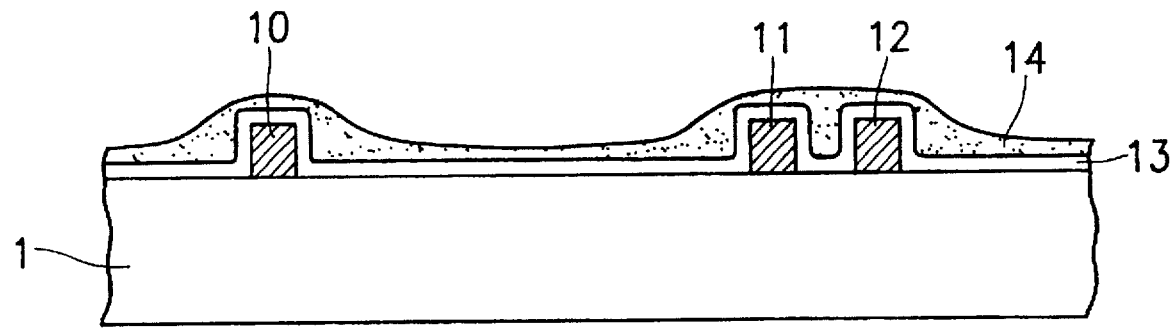
Figs. 1A–1B depict a conventional process for multimetal planarization in cross-sectional views.
Figure 1B:
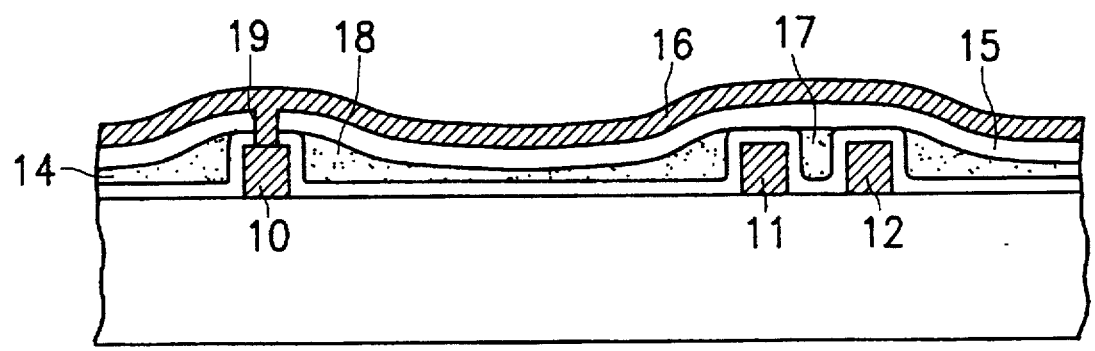
Figure 2A:
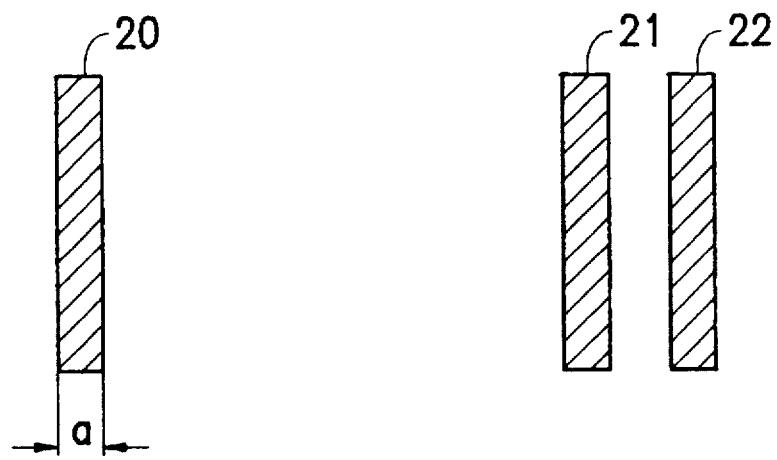
FIGS. 2A–2G depict a method for forming a metal pattern, in top views, according to the preferred embodiment of the present invention.
Figure 2B:
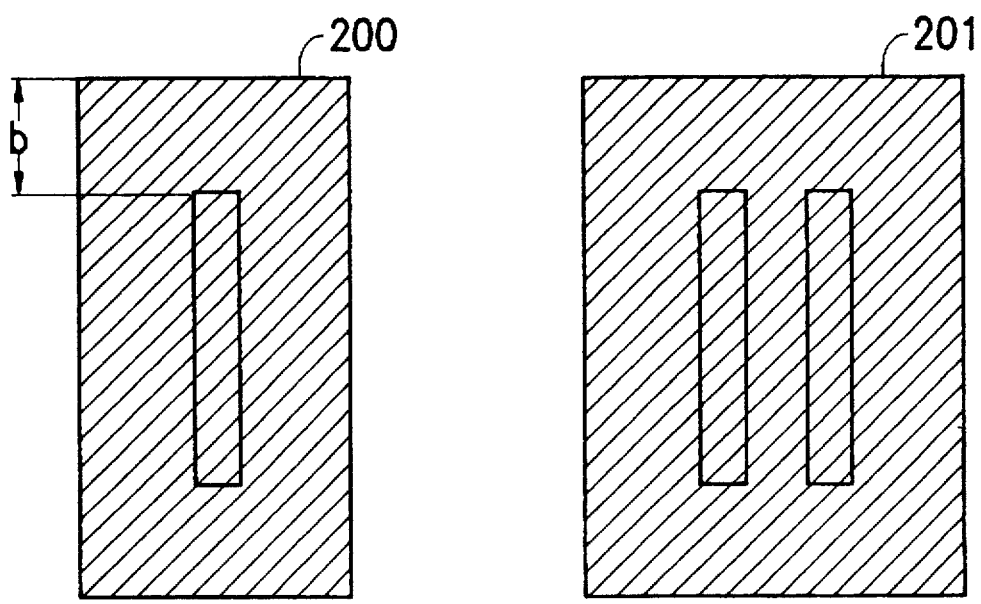

FIGS. 2A–2G depict a method for forming a metal pattern, in top views, according to the preferred embodiment of the present invention. As first shown in FIG. 2A, numerals 20,21,22 are metal line patterns serving as the interconnections to active regions of devices (not shown in the drawings), each of which is provided with a line width a. The line width a is limited by the process resolution, ranging from about 0.4 µm to about 2 µm depending on the progress of fabrication techniques. Then, along the periphery of each metal line patterns 20,21,22, as illustrated in FIG. 2B, extending outwards a distance b is applied and is incorporated with the overlapped portion to form regions 200 and 201, wherein region 200 comes from the extension of metal line pattern 20, and region 201 the extension and incorporation of metal line patterns 21 and 22. Preferably, the distance b ranges from about 0.5 µm to about 5 µm.

Figure 2C:
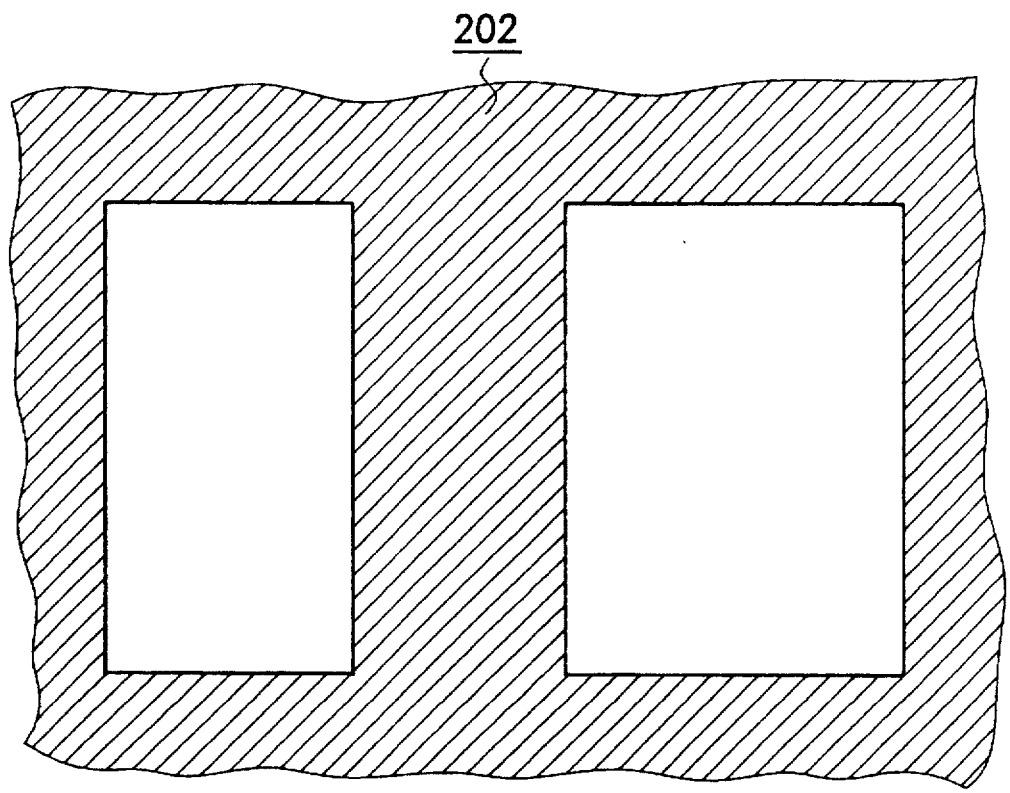
Figure 2D:
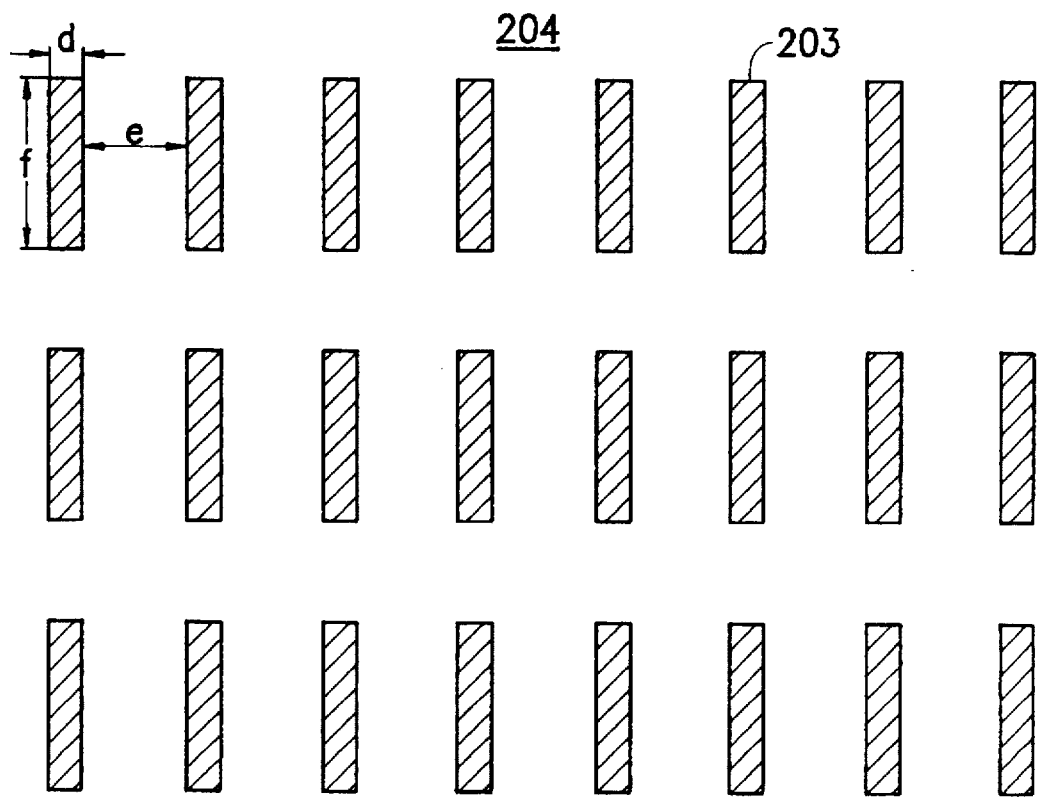

Afterwards, the tone of the pattern depicted in FIG. 2B is reversed to form a first pattern 202 as shown in FIG. 2C. Meanwhile, a block array pattern 204 ( also called as a quantum array pattern) illustrated in FIG. 2D is used, which comprises of several blocks 203 arranged in an array. Each of the blocks has a length f and a width d, and a spacing e is provided therebetween. Preferably, the length f ranges about 0.1–3 µm, the width d is in the range of about 0.1–3 µm, and, further, the spacing e a range of about 0.5–3 µm, respectively.

Figure 2E:
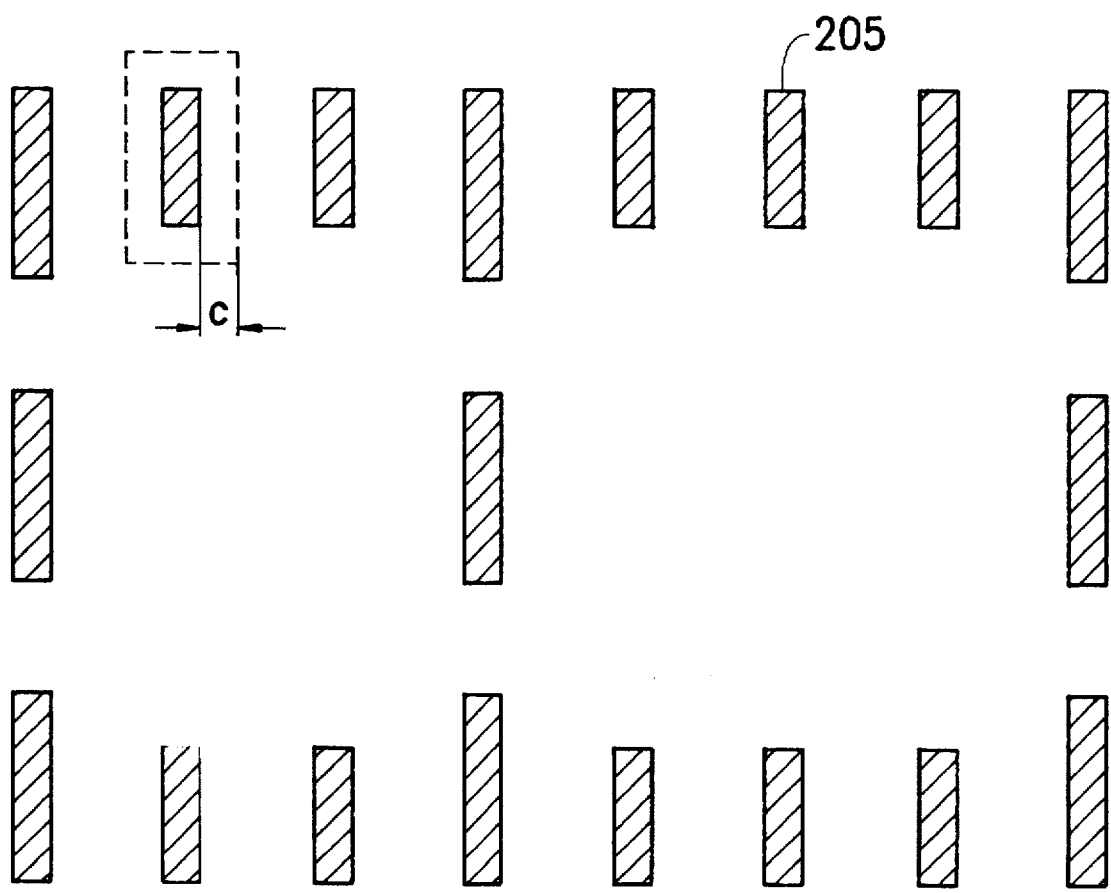

Next referring to FIG. 2E, a second pattern 206 is formed resulting from an "AND" operation applied to the patterns shown in FIG. 2C with FIG. 2D, that is the selection of the overlapped pattern between first pattern 202 and block array pattern 204, and therefore selected second pattern 206 comprises of several blocks 205, too. Moreover, along the periphery of the blocks 205 constituting second pattern 206, extending outwards another distance c is applied to second pattern 206 and then forms a third pattern 208 shown in FIG. 2F, comprising several extended blocks 207, wherein the extending distance c ranges from about 0.4 µm to about 2 µm.

Figure 2F:
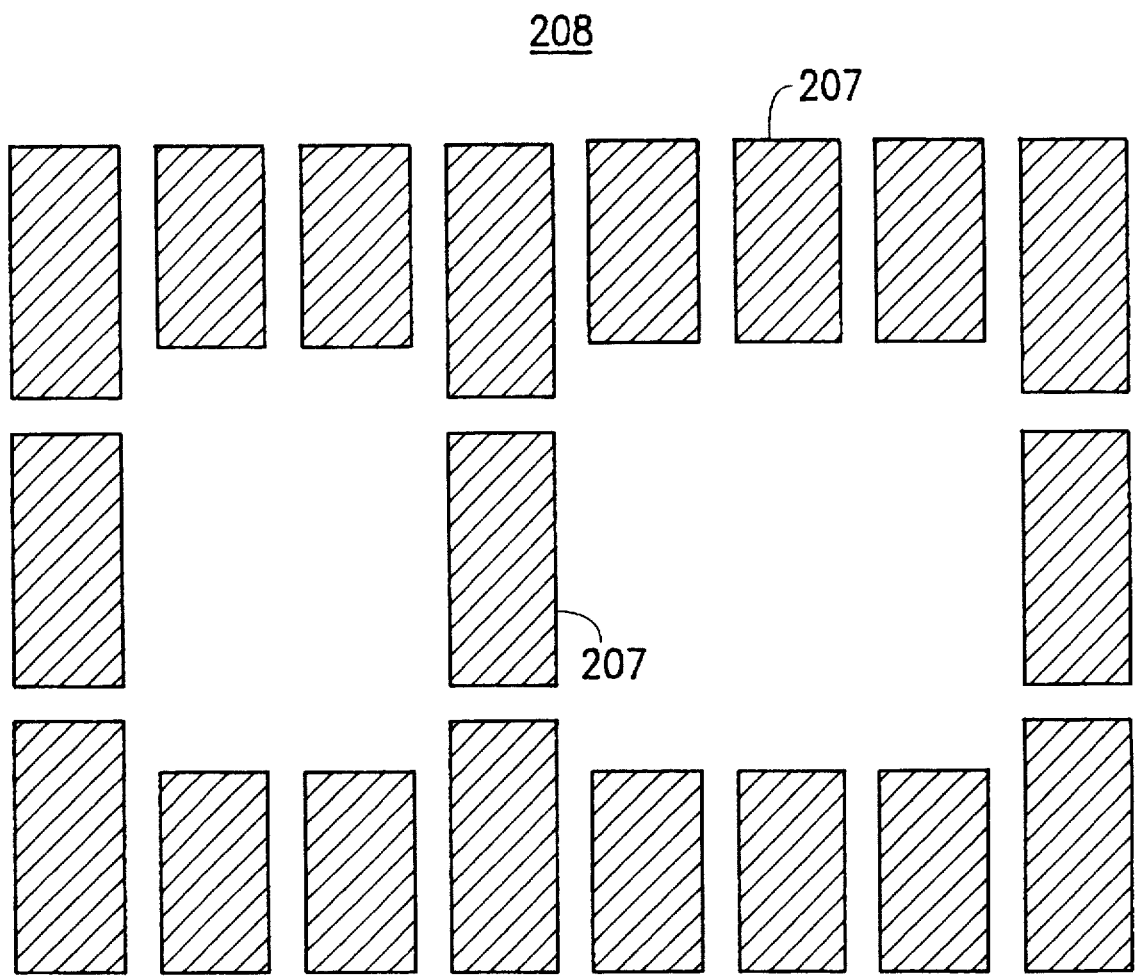
Figure 2G:
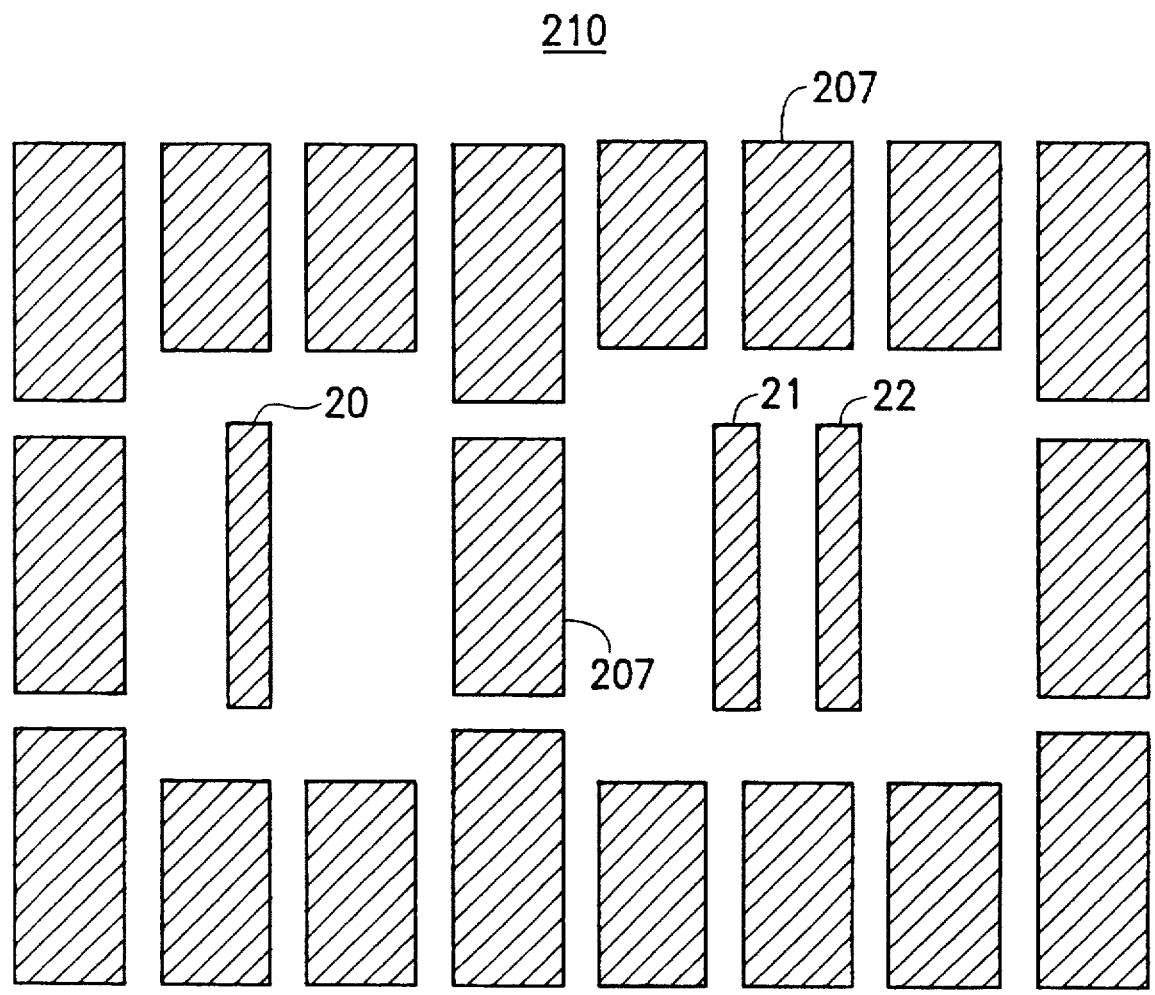

Finally, as shown in FIG. 2G, an "OR" operation is applied to the pattern depicted in FIG. 2F with FIG. 2A, meaning the metal line patterns 20,21,22 are positioned into third pattern 208 to form a metal pattern 210 in accordance with the relative location illustrated above. However, a maximum spacing, b+e-c between the metal line pattern 20,21,or 22 and the extended blocks 207 may occur. As mentioned above, the SOG planarization limit, designated by g, is in the range of about 5–10 µm, and the resolution limit, designated by h, limited by the process technique; therefore the values b,c,d,e,f,g,h conform to the following inequality formulas:

$$d+2c>h \quad (1)$$

$$f+2c>h \quad (2)$$

$$b+e-c<g \quad (3)$$

$$e-2c<g \quad (4)$$

Figure 3A:
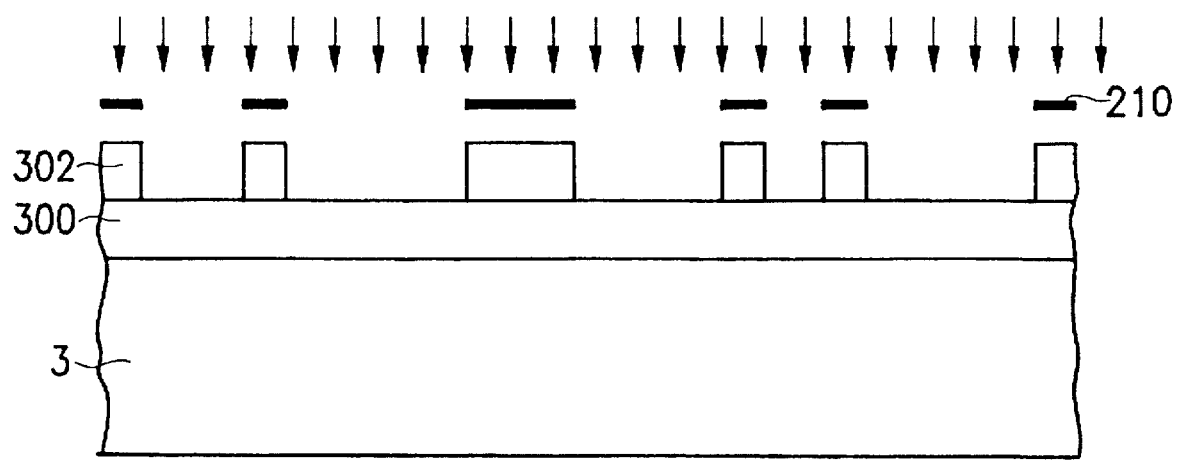
FIGS. 3A–3C depict the metal pattern, formed by the method depicted in FIG. 2A–2G, applied in the process of multimetal structure in cross-sectional views.
Figure 3B:
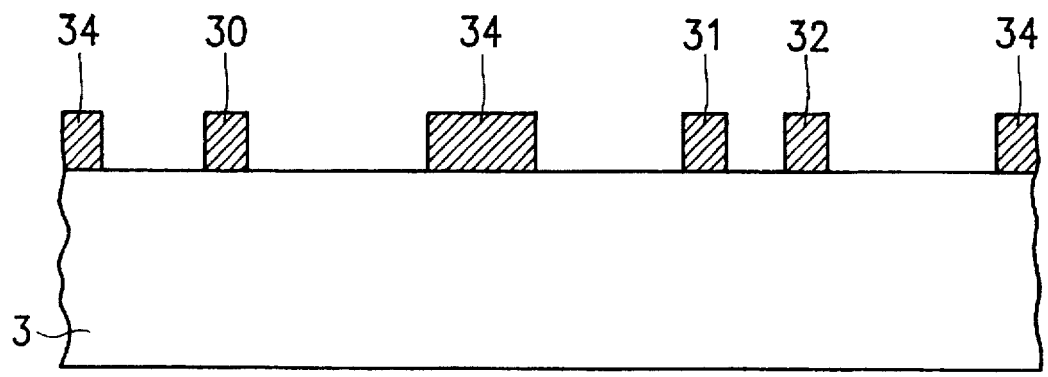
Figure 3C:
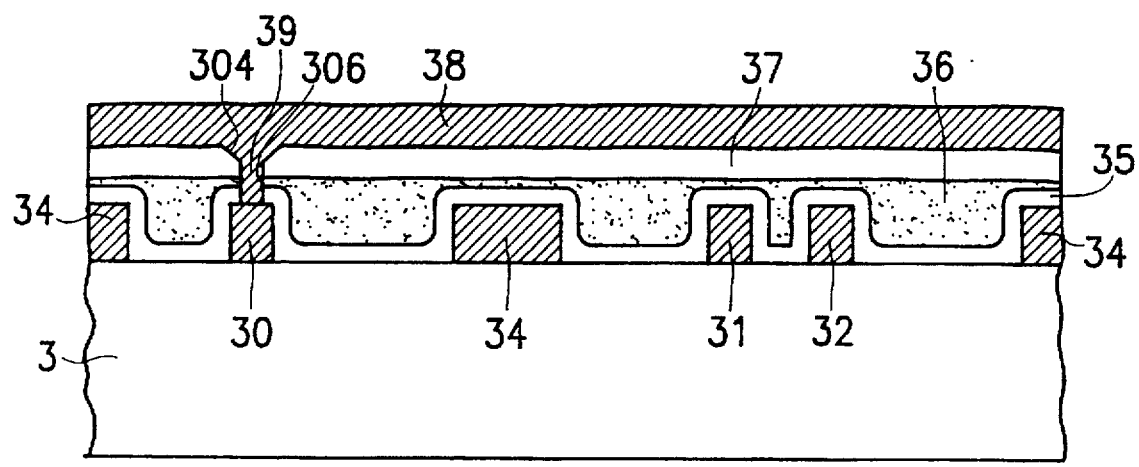

Afterwards, the metal pattern 210 is utilized in a process for fabricating multimetal structure. FIGS. 3A–3C depict the metal pattern, formed by the method depicted in FIG. 2A–2G, applied to the process of multimetal structure in cross-sectional views, which is suited to a dielectric layer 3 formed over the surface of a semiconducting substrate, such as a silicon substrate (the drawings illustrates just the portion above the dielectric layer 3). This dielectric layer 3 is composed of, for example, field oxide formed through the LOCOS method.

First, as shown in FIG. 3A, a first metal layer 300 is formed on the dielectric layer 3 and a photoresist layer 302 is formed on first metal layer 300 patterned by the metal layer pattern 210 depicted in FIG. 2G through a lithography procedure. Then, through the shielding of the photoresist layer 302, first metal layer 300 is etched to form metal lines 30,31,32 and dummy metals 34 on the dielectric layer 3 as the cross-sectional view shown in FIG. 3B.

Referring to FIG. 3C, a first isolating layer 35, such as silicon oxide with a thickness about 3000Å, is deposited on metal lines 30,31,32, dummy metals 34 and dielectric layer 3 by plasma-enhanced chemical vapor deposition (PECVD). Owing to the configuration of metal lines 30,31,32 deposed onto dielectric layer 3, first isolating layer 35 reveals several trenches among metal lines 30,31,32 and dummy metals 34. Afterwards, an SOG layer 36 is employed to fill such trenches for planarization. Because SOG materials are siloxanes or silicates mixed in alcohol-based solvents in liquid form, such materials can fill into the concave surface after being subjected to a spin cycle. Apparently, the spacings among those metal lines exceeding the SOG planarization limit, such as the spacing between metal lines 30 and 31, are diminished because of the arrangement of dummy metals 34. After being spun on, the SOG is baked first at a low temperature (e.g., 150°–250° C. for 1–15 min. in air), an then at a higher temperature (e.g., 400°–425° C. for 30–60 min. in air). The solvent is first driven off, and water is evolved from the film ( due to the polymerization of the silanol [SiOH] groups).

Furthermore, an etchback SOG process optionally applied to the surface of SOG layer 36 and then a second insulating layer 37, such as silicon oxide of about 5000Å in thickness, is deposited over the fully planarized surface, actually on SOG layer 36. Subsequently, subjected to wet and dry etching, a contact window 39 is formed through insulating layers 35, 37 and SOG layer 36 to expose the designated metal line 30, wherein inclined portion 304 is formed by the wet etching and the vertical portion 306 is formed by the dry etching, respectively. The formation of inclined portion 304 can improve the step coverage of the following layer deposited thereon. Then, a second metal layer 38 is sputtered onto second insulating layer 37 to concurrently contact with metal line 30 via contact window 39.

In conclusion, the metal pattern formed by the method of the present invention makes use of the quantum array pattern accompanying the metal line pattern then to perform a combination of oversizing, downsizing, "AND", "OR" logic operation, or incorporation, etc., by means of computer-aided design (CAD). Consequently, the dummy metals are arranged among the metal lines while the spacings therebetween exceed the SOG planarization limit to diminish the spacing for full planarization. Furthermore, the arrangement of the dummy metal not only prevents the loading effect when etching, but also decreases the parasitic capacitance therebetween because the dummy metals are shaped in blocks and isolated from each other.

While the invention has been described in terms of what is presently considered to be the most practical and preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A method of forming a metal pattern for use in an integrated circuit device fabrication process, the metal pattern including metal lines having an length and width, the method comprising:

providing a first pattern having first lines corresponding to the metal lines, the first lines having a length and width larger by a first distance b than the length and width of corresponding metal lines;

providing an inverse of the first pattern;

providing a block array pattern having a plurality of dummy lines, each with a length f, a width d, and a spacing e, between adjacent dummy lines;

providing a second pattern of second lines having a length and width by ANDing the block array pattern and the inverse of the first pattern;

providing a third pattern having third lines corresponding to the second lines of the second pattern, the third lines having a height and width larger by a second distance c than the length and width of corresponding second lines; and forming the metal pattern by ORing the metal lines with the third pattern.

2. The method of claim 12, wherein the integration circuit device fabrication process has a planarization limit g and a resolution limit h and the values of b, c, d, e, f, g, and h conform to the following relationships:

$g > b + e - c$;

$g > e - 2c$;

$d + 2c > h$; and $f + 2c > h$.

3. The method of automatically generating dummy metals for multilevel interconnection as in claim 1 applied to a fabrication process for multimetal interconnection, wherein said process comprises:

providing a dielectric layer;

forming a first metal layer on said dielectric layer;

etching and patterning said first metal layer into a plurality metal lines and dummy metals there among according to said metal pattern;

forming a first insulating layer overlying said metal lines, dummy metals, and dielectric layer;

forming an SOG (spin-on glass) layer overlying said first insulating layer;

forming a second insulating layer on said SOG layer;

etching said second insulating layer, SOG layer and first insulating layer to form openings exposing a portion of said metal lines; and forming a second metal layer connecting to said exposed metal lines via said opening.

4. The method of automatically generating dummy metals for multilevel interconnection as in claim 3, wherein said first insulating layer is silicon oxide formed by PECVD (plasma-enhanced chemical vapor deposition).

5. The method of automatically generating dummy metals for multilevel interconnection as in claim 3, wherein said second insulating layer is silicon oxide formed by PECVD (plasma-enhanced chemical vapor deposition).

6. The method of automatically generating dummy metals for multilevel interconnection as in claim 3, wherein said etching procedure sequentially utilizes wet and dry etching steps.

\* \* \* \* \*